(12) United States Patent
Sasaki

(10) Patent No.: US 7,750,834 B2
(45) Date of Patent: Jul. 6, 2010

(54) ENCODER FOR A PIPELINED ANALOG-TO-DIGITAL CONVERTER

(75) Inventor: Seiichiro Sasaki, Saitama (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 0 days.

(21) Appl. No.: 12/357,433

(22) Filed: Jan. 22, 2009

(65) Prior Publication Data

US 2009/0189798 A1 Jul. 30, 2009

(30) Foreign Application Priority Data

Jan. 24, 2008 (JP) ............................. 2008-013379

(51) Int. Cl.
H03M 1/38 (2006.01)
(52) U.S. Cl. ..................... 341/161; 341/156; 341/162
(58) Field of Classification Search ................ 341/156, 341/161, 162
See application file for complete search history.

(56) References Cited

U.S. PATENT DOCUMENTS

| | | | | |
|---|---|---|---|---|
| 5,274,377 A | | 12/1993 | Matsuura et al. | |
| 5,929,799 A | * | 7/1999 | Rothenberg | 341/156 |
| 6,195,032 B1 | * | 2/2001 | Watson et al. | 341/162 |
| 6,369,744 B1 | * | 4/2002 | Chuang | 341/161 |
| 6,437,608 B1 | | 8/2002 | Miyabe et al. | |
| 6,803,873 B1 | * | 10/2004 | Motomatsu | 341/161 |
| 7,348,916 B2 | * | 3/2008 | Ogita et al. | 341/161 |

* cited by examiner

Primary Examiner—Khai M Nguyen
(74) Attorney, Agent, or Firm—Volentine & Whitt, PLLC

(57) ABSTRACT

In a pipelined analog-to-digital (AD) converter, if logically incongruent signals S1 and S2 are output from an AD converter section of a converter stage of the AD converter, a digital-to-analog converter (DAC) section is to be prevented from erroneously operating. When a logically incongruent combination of signals S1 and S2, such as S1="H" and S2="L", is output from comparators that compare an input voltage VI to reference voltages +REF/4 and −REF/4, an encoder outputs a signal corresponding to a normal signal combination (S1="L" and S2="H") to generate signals X, Y and Z that control switches of the DAC section. This eliminates the risk that the switches shall be turned on simultaneously, thus preventing the erroneous operation of the DAC section.

3 Claims, 4 Drawing Sheets

ENCODER FOR A PIPELINED ANALOG-TO-DIGITAL CONVERTER

BACKGROUND OF THE INVENTION

1. Field of the Invention

The present invention relates to a pipelined analog-to-digital converter having a plurality of 1.5-bit converter stages cascaded to each other.

2. Description of the Background Art

At first, reference will be made to FIG. 2A, which is a schematic block diagram showing a conventional pipelined analog-to-digital converter disclosed by U.S. Pat. No. 6,437,608 B1 to Miyabe et al., and U.S. Pat. No. 5,274,377 to Matsuura et al. FIG. 2B is a graph plotting the input/output characteristics of each 1.5-bit converter stage (STG) shown in FIG. 2A. In the following, signals are indicated with reference numerals of connections on which they are conveyed.

The pipelined analog-to-digital converter 10 shown in FIG. 2A showing its overall constitution includes a sample and hold amplifier (SHA) 12, a plurality of 1.5-bit cascaded converter stages 14, 16 and 18 which are interconnected in cascade on the output side of the sample and hold amplifier 12, an analog-to-digital converter (ADC) unit 20 which is connected to the output port 44 of the last one 18 of the cascaded converter stages, and an error correction logic (ECL) 22.

The sample and hold amplifier 12 is adapted for sampling an analog input signal 24 at a predetermined time interval in response to a clock signal CK, and holds resulting samples. The sample and hold amplifier 12 transfers the resulting samples 28 to the initial converter stage 14 in the form of input voltage VI.

The initial converter stage 14 is adapted for comparing the input voltage 28 having its value VI to reference voltages 30 and 32 having the values +REF/4 and −REF/4, respectively, FIG. 3, to determine in which of three voltage ranges the input voltage VI falls, namely, a voltage range A not higher than −REF/4, a voltage range B between −REF/4 and +REF/4 or a voltage range C not lower than +REF/4, FIG. 2B. The converter stage 14 in turn outputs the result of determination as a 1.5-bit digital signal 34 to the error correction logic ECL. Thus, the converter stage 14 outputs an output voltage 36 which is twice as high as the difference between the input voltage 28 and a voltage corresponding to either of the digital signals, i.e. −REF, 0 or +REF, as an output signal 36 on its downstream side. The other converter stages 16-18 work in a similar way to supply the error correction logic 22 with digital signals 38 and 40, respectively, and the respective downstream sides with output voltages 42 and 44. The digital signals from the converter stages 14, 16-18 are actually composed of two bits, but they are expressed as 1.5-bit signals in this description in consideration that there are only three information quantities output from each of the converter stages. Similarly, the signals of three kinds of information will be hereinafter referred to as "1.5-bit signals."

The ADC unit 20 is adapted for converting the voltage 44 from the converter stage 18 to a two-bit digital signal 46. The error correction logic 22 is adapted for receiving the digital signal 46 from the ADC unit 20 as well as signals 34, 38 and 40 from the converter stages 14, 16 and 18, respectively, and processing them to output an ultimate digital signal 50.

FIG. 3 shows an example of conventional converter stage (STG). The converter stage 14, 16 or 18 includes an analog-to-digital converter (ADC) section 52, an encoder (ENC) 54, a digital-to-analog converter (DAC) section 56, and an amplifier (AMP) 58.

The ADC section 52 is adapted for receiving an input voltage VI from its upstream side and generating 1.5-bit signals based on the input voltage VI. Specifically, the ADC section 52 includes comparators 59 and 60 (CMPs), which compare the input voltage VI to the reference voltages +REF/4. The comparator 59 is adapted for outputting a signal S1 at its high level "H", such as a power supply voltage VDD, when VI>+REF/4, or at its low level "L", such as ground potential GND, when VI≦+REF/4. The comparator 60 is adapted for outputting a signal S2 at its level "H", when VI>−REF/4, or at its level "L", when VI≦−REF/4. Thus, the combinations of output signals S1 and S2 output from the ADC section 52 are (H, H), (L, H) and (L, L) when VI>+REF/4, +REF/4≧VI>−REF/4 and VI≦−REF/4, respectively. The ADC section 52 supplies these 1.5-bit signals to the error correction logic 50 and the encoder 54.

The encoder 54 is adapted for generating signals X, Y and Z in response to the signals S1 and S2, and the clock signal CK to transfer the signals X, Y and Z to the DAC section 56. The encoder 54 includes dual-input NAND gates 76 and 78, inverters 80 and 82, and a tri-input NAND gate 84. The NAND gate 76 receives the signal S1, while the NAND gate 84 receives an inverted signal into which the inverter 82 inverted the the signal S1. The NAND gate 84 receives the signal S2, while the NAND gate 78 receives a signal into which the inverter 80 inverted the signal S2. The NAND gates 76, 78 and 84 also receive the clock signal CK commonly. The NAND gates 76, 78 and 84 output the signals X, Y and Z, respectively.

With the above logics constitution, the combination of signals X, Y and Z produced from the encoder 54 depends on the signals S1 and S2 from the ADC section 52 and the clock signal CK, as will read below:

for CK="L", signals X, Y and Z are all "H" independently of signals S1 and S2, and for CK="H", (X, Y, Z)=(L, H, H) for (S1, S2)=(H, H), (X, Y, Z)=(H, H, L) for (S1, S2)=(L, H) and (X, Y, Z)=(H, L, H) for (S1, S2)=(L, L).

The DAC section 56 is adapted for outputting a reference voltage +REF, −REF or 0 as a voltage 86 in response to the signals X, Y and Z from the encoder 54. Specifically, the DAC section 56 includes switches 88, 90 and 92, which are controlled by the signals X, Y and Z, respectively. When the signal X turns on the switch 88, the voltage 86 will be equal to −REF. When the signal Y turns on the switch 90, it will be equal to +REF, and when the signal Z turns on the switch 92, it will be equal to zero. Each of the switches 88 to 92 is set so as to be turned on or off in response to its corresponding control signal X, Y or Z is "L" or "H", respectively. When the signals X, Y and Z are all "H", the voltage 86 ceases to output.

The amplifier 58 is adapted for amplifying the voltage difference between the input voltage VI and the output voltage 86 from the DAC section 56 by a factor of two, and outputting a resulting amplified voltage VO. The amplifier 58 includes switches 94, 96 and 98, capacitors 100 and 102 of the same capacity, and an operational amplifier (OP) 104. The switches 94 and 96 are adapted for selecting the input voltage VI when the clock signal CK is "L", while respectively selecting the output voltage VO and the output voltage 86 of the DAC section 56 when the clock signal CK is "H". Specifically, the switches 94 and 96 have output ports connected to a node 106 via the capacitors 100 and 102, respectively. The switch 98 is, when the clock signal CK is "L", turned on to connect the node 106 to the ground voltage (GND). The operational amplifier 104 is adapted for amplifying the voltage on the node 106 to deliver the resulting amplified voltage VO to one of the converter stages (STGs) interconnected on its downstream side.

The operation of the pipelined analog-to-digital converter will now be described, which includes the multiple converter stages connected in cascade.

The analog input signal 24 is sampled and held by the sample and hold amplifier 12, in response to the clock signal CK, and thereafter delivered as the input voltage 28 to the initial converter stage 14. In the initial converter stage 14, the input voltage 28 is compared by the ADC section 52 to the reference voltages +REF/4 and −REF/4. The result of comparison is delivered as the signals S1 and S2 to the error correction logic 22 and to the encoder 54 of the converter stage 14.

In the encoder 54, the signals X, Y and Z are generated in dependent upon a combination of clock signal CK and signals S1 and S2. The signals X, Y and Z are delivered to the DAC section 56, from which the reference voltage +REF, −REF or 0 is generated as the voltage 86, in dependent on a combination of signals X, Y and Z. The so generated reference voltage is supplied to the amplifier 58.

In the amplifier 58, a voltage corresponding to the input voltage 28 minus the output voltage 86 is amplified to be doubled by switching the capacitor 100 or 102 in response to the clock signal CK to output the output voltage 36 indicating this doubled voltage.

Thus, as shown in FIG. 2B, if the input voltage 28 of the converter stage 14 is not higher than the value −REF/4, the output voltage 36 ranges between the values −REF and +REF/2. If the input voltage 28 ranges between values −REF/4 and +REF/4, the output voltage 36 ranges between values −REF/2 and +REF/2. If the input voltage 2B is not less than value +REF/4, the output voltage 36 ranges between values −REF/2 and +REF. The output voltage 36 is delivered to the next converter stage 16 as the input voltage 36 of the latter.

In this manner, a 1.5-bit digital signal is output from each converter stage in response to the clock signal CK. The so generated digital signals are input to the error correction logic 22 to be pipelined to generate a predetermined number of bits of the digital signal 50.

In each converter stage (STG) described above referring to FIG. 3, the encoder 54 generates the signals X, Y and Z for the DAC section 56, on the premise that there are only three combinations of signals S1 and S2 supplied from the ADC section 52, namely (H, H), (L, H) and (L, L). Thus, if there is logical incongruence in a combination of signals S1 and S2, that is, S1="H" and S2="L", there will be an abnormal combination of signals X, Y and Z generated, thereby causing the DAC section 56 to erroneously operate.

More specifically, in the encoder 54 of FIG. 3, if the signals S1 and S2 delivered are respectively "H" and "L", and the clock signal CK is "H", the output signals X, Y and Z will be respectively "L", "L" and "H". Because both the signals X and Y are "L", the switches 88 to 92 in the DAC section 56 will be all turned on. This short-circuits the current path between the reference voltages +REF and −REF via the switches 88 to 92, with the result that the output voltage 86 is of an abnormal value. Even if a combination of signals S1 and S2 reverts to its normal combination of values by the next input voltage VI, it will take much time until the voltage 86 reverts to its normal combination. During this time interval, normal operations for conversion may not be attained.

It should be noted that the situation in which logically incongruent signals S1 and S2 are output from the ADC section 52 is hardly liable to occur in general in the case of ADC sections manufactured by a normal production process. However, the situation may arise in such a case that ADC sections having comparators 59 and 60 or circuits for generating voltages +REF/4 and −REF/4 suffer from variations in characteristics due to changes in the production process or the like. Heretofore, such ADC sections are discarded as rejects in the course of product inspection, thus lowering the yield.

SUMMARY OF THE INVENTION

It is an object of the present invention to provide a pipelined analog-to-digital converter having an encoder normally operable even in response to an incongruent combination of signals provided by an ADC section included therein.

In accordance with the present invention, there is provided a pipelined analog-to-digital converter including a plurality of converter stages interconnected in cascade, each of the converter stages including an analog-to-digital converter section for comparing an input voltage to a first reference voltage to output a first signal indicating the result of the comparison and for comparing the input voltage to a second reference voltage lower than the first voltage to output a second signal indicating the result of the comparison, each converter stage also including a digital-to-analog converter section operative in response to a combination of the first and second signals for outputting either one of a third reference voltage, a fourth reference voltage higher than the third reference voltage and a fifth reference voltage lower than the third reference voltage, each converter stage further including an amplifier for amplifying a difference voltage between the input voltage and an output voltage from the digital-to-analog converter section to output a resulting signal to its downstream side. The pipelined analog-to-digital converter according to the invention outputs a digital signal relevant to the analog voltage delivered to the initial converter stage in response to the first and second signals of the analog-to-digital converter section of each converter stage. Each converter stage further includes an encoder designed so that, when logical incongruence resides in the combination of the first and second signals output from the analog-to-digital converter section, the encoder will output a signal corresponding to the combination of the first and second signals with logical congruence in the combination to cause the digital-to-analog converter to output either one of the third, fourth and fifth reference voltages.

The present invention can thus accomplish an analog-to-digital converter capable of continuing normal conversion operation without fear of short-circuiting the third and fifth reference voltages in the digital-to-analog converter section via, e.g. the changeover switches, even when the analog-to-digital converter section erroneously operates.

BRIEF DESCRIPTION OF THE DRAWINGS

The objects and features of the present invention will become more apparent from consideration of the following detailed description taken in conjunction with the accompanying drawings in which.

DESCRIPTION OF THE PREFERRED EMBODIMENTS

Figure 1:
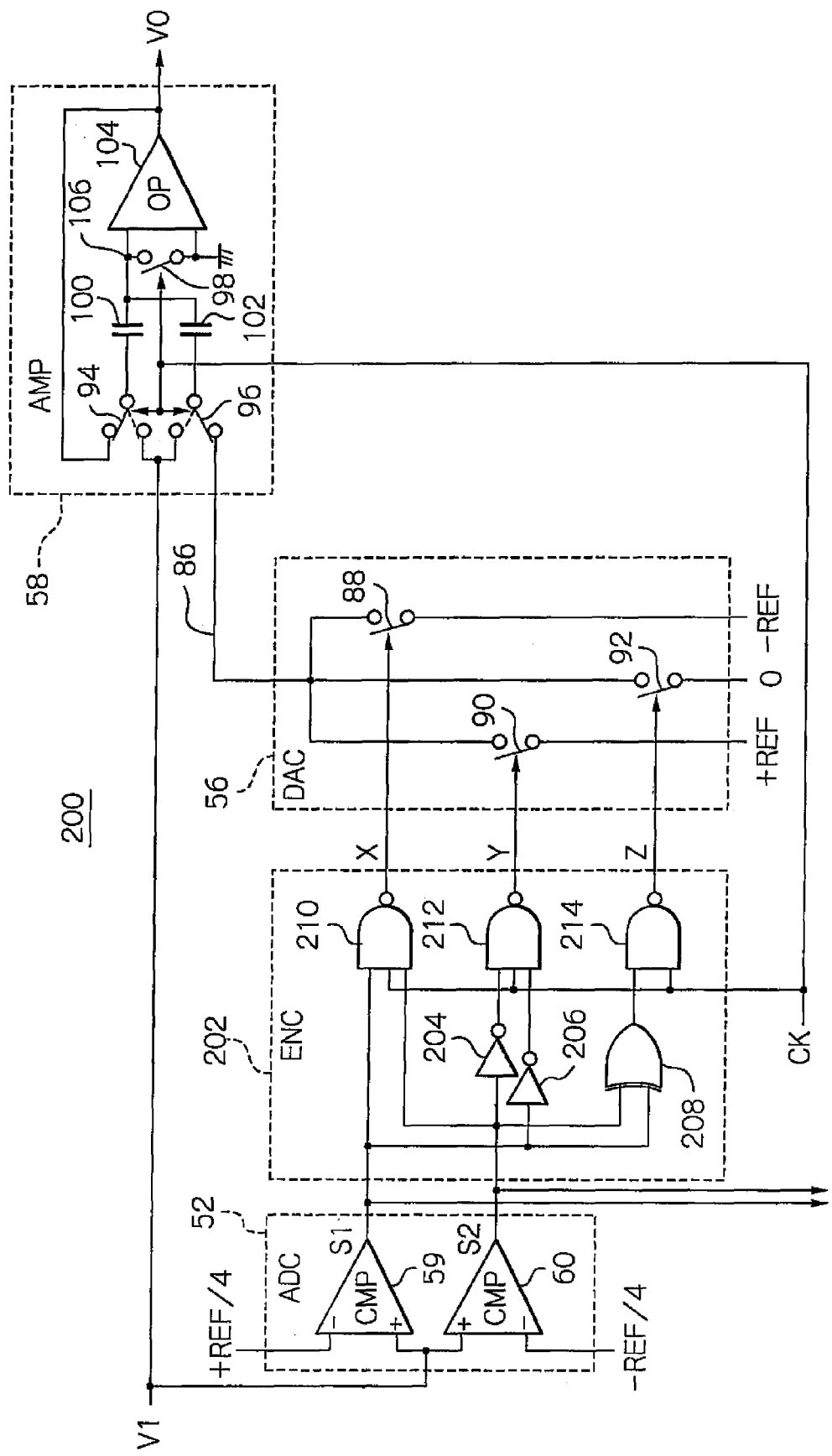
FIG. 1 is a schematic circuit diagram showing a specific configuration of an illustrative embodiment of a converter stage in accordance with the present invention.

Now, preferred embodiments of an analog-to-digital converter according to the present invention will be described in detail with reference to the accompanying drawings. It should be noted that the drawings are for illustration only and are not intended to limit the scope of the invention.

First, an illustrative embodiment of the present invention will be described with reference to FIG. 1, which is a schematic circuit diagram showing a converter stage (STG) according to the embodiment of the present invention. Like elements or components are designated with the same reference numerals, and therefore no redundant description will be repeated.

Figure 2A:
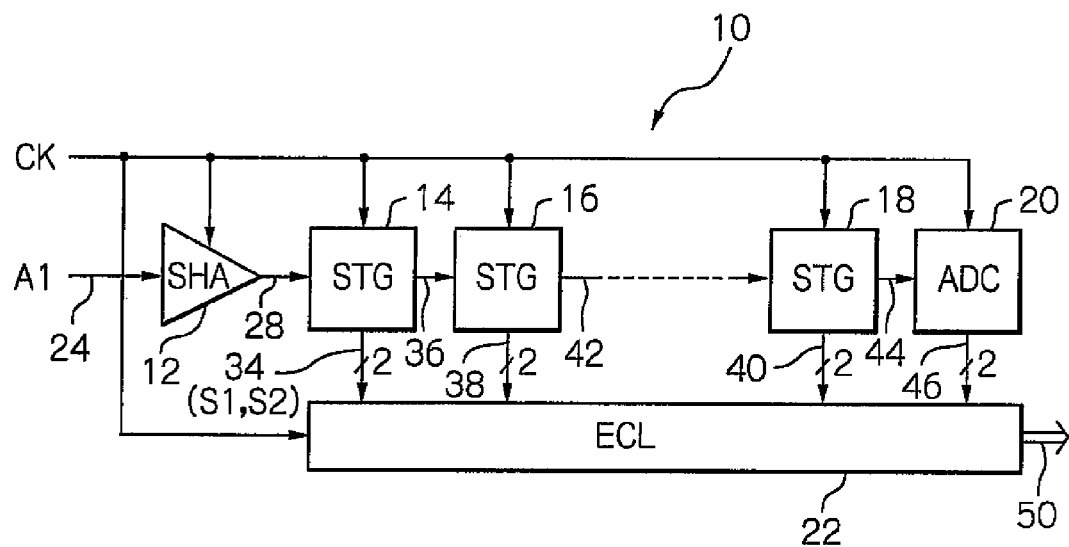
FIG. 2A is a schematic block diagram showing a conventional pipelined analog-to-digital converter.
Figure 2B:
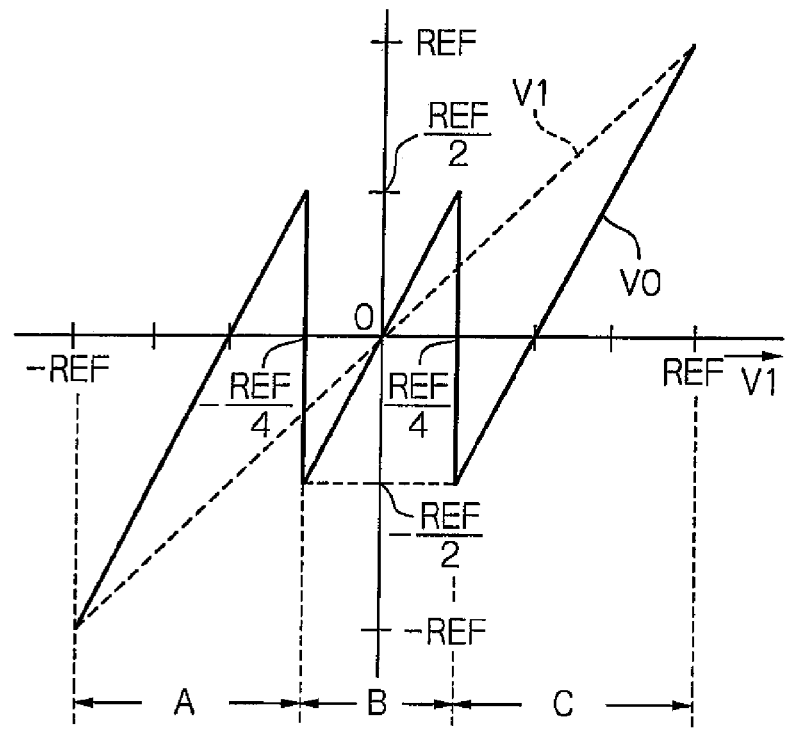
FIG. 2B is a graph useful for understanding input/output characteristics of each converter stage of the pipelined analog-to-digital converter shown in FIG. 2A.
Figure 3:
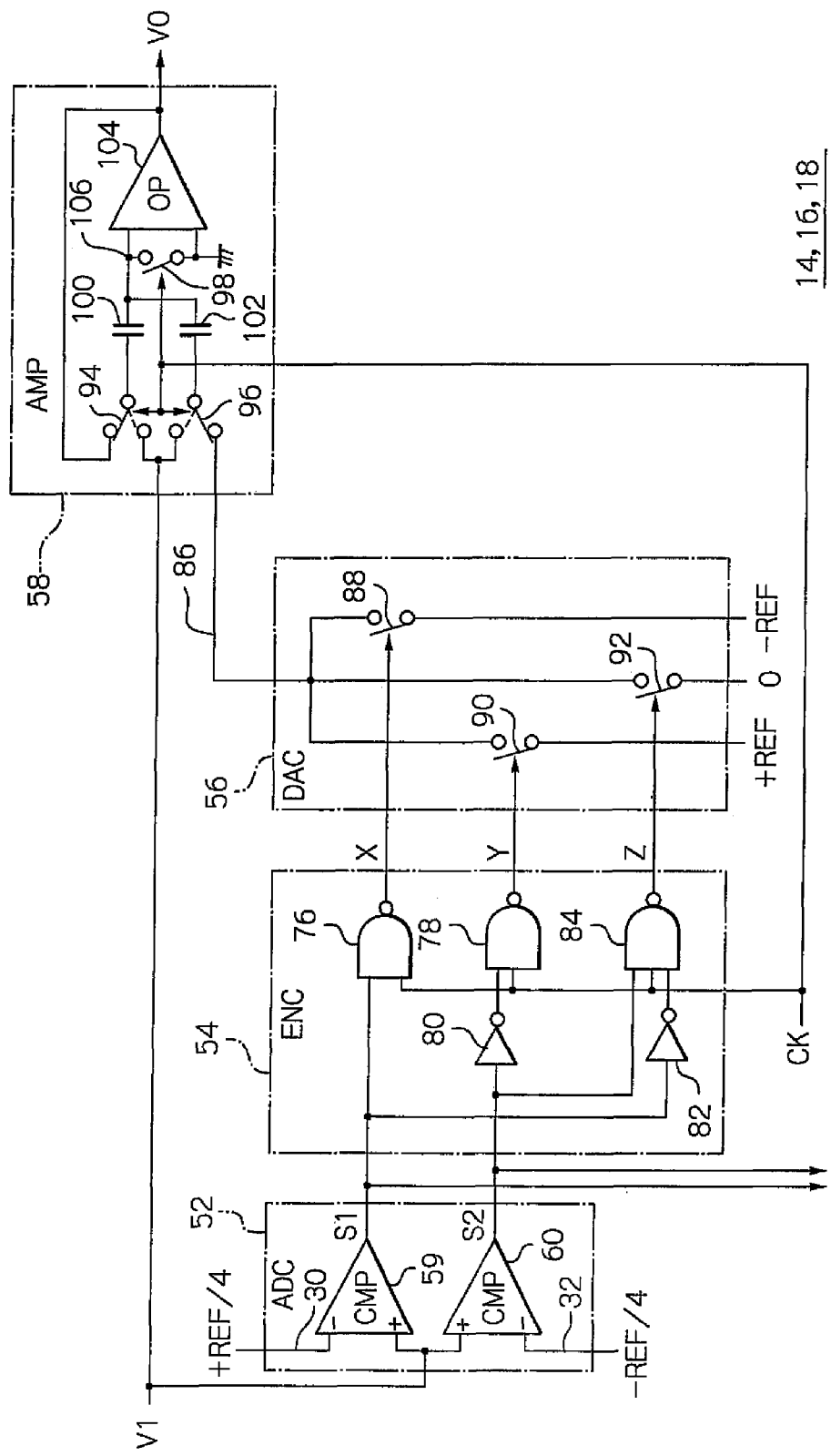
FIG. 3 is a schematic circuit diagram showing an example of conventional converter stage.

The converter stage (STG) 200 shown in FIG. 1 may be used for the pipelined analog-to-digital converter shown in FIG. 2A in the same way as FIG. 3. The converter stage 200 includes an encoder (ENC) 202, which is different in logical constitution from the encoder 54 shown in FIG. 3, in place of the encoder 54.

The encoder 202 is adapted for generating signals X, Y and Z that control the DAC section 56 in response to the clock signal CK and the signals S1 and S2 supplied from the ADC section 52. The encoder 202 includes inverters 204 and 206, an exclusive OR (XOR) gate 208, tri-input NAND gates 210 and 212, and a dual-input NAND gate 214. Signals may sometimes be designated with reference numerals of connections on which they are conveyed.

In the encoder 202, the NAND gate 210 and the XOR gate 208 are connected to receive the signal S1, while the NAND gate 212 is connected to receive a signal into which the inverter 206 inverted the signal S1. The NAND gate 210 and the XOR 208 are connected to receive the signal S2, while the NAND gate 212 is connected to receive a signal into which the inverter 204 inverted the signal S2. The NAND gate 214 is connected to receive the output from the XOR gate 208. The NAND gates 210, 212 and 214 are also connected to receive the clock signal CK commonly. The NAND gates 210, 212 and 214 output the signals X, Y and Z, respectively. The remaining portions of the ADC section 52, DAC section 56 and amplifier 58 may be the same in constitution as FIG. 3.

Below, a description will be given of the logical operation of the encoder 202 in accordance with the embodiment, thereby rendering the operation of the converter stage also clarified in the embodiment. If the clock signal CK is "L", then the signals X, Y and Z, respectively output from the NAND gates 210, 212 and 214, all will be "H" in level without regard to the logical state of the signals S1 and S2 supplied from the ADC section 52.

If conversely the clock signal CK is "H", then the output signals X, Y and Z are changed in response to the signals S1 and S2, which are supplied from the ADC section 52 depending on the relationship between the input voltage VI and the reference voltages +REF/4 and −REF/4.

When VI>+REF/4, the signals S1=S2="H" are supplied from the ADC section 52 to the encoder 202. In this case, the signals X, Y and Z from the NAND gates 210, 212 and 214 will be "L", "H" and "H", respectively. When +REF/4≧VI>−REF/4, the signals S1="L" and S2="H", and the signals X, Y and Z will be "H", "H" and "L", respectively. If VI≦−REF/4, the signals S1=S2="L", and the signals X, Y and Z will be "H", "L" and "H", respectively. These states are the same as the encoder 54 shown in FIG. 3.

If, under some situation, the ADC section 52 supplies signals S1="H" and S2="L", the signals X, Y and Z will be "H", "H" and "L", respectively. These signals X, Y and Z are the same as the signal S1="L" and the signal S2="H".

In summary, the converter stage 200 of the present embodiment described above is so structured that, if a logically incongruent combination of signals S1 and S2 is output from the ADC section 52, the encoder 202 generates the signals X, Y and Z for the case of +REF/4≧VI>−REF/4 to deliver them to the DAC section 56. It is thus possible to prevent the DAC section 56 from falling into its abnormal state in which the reference voltages +REF and −REF are short-circuited via the switches 88 and 90. Thus, the same result is output as in the case the decision is carried over until a result is output on the downstream side of the converter stage. That is, with use of the converter stage just described, it is possible to provide a pipelined analog-to-digital converter capable of continuing with the normal operation of conversion even in case the ADC section 52 outputs an incongruent combination of signals S1 and S2 which may be caused by variations in characteristics of the circuitry.

Figure 4:
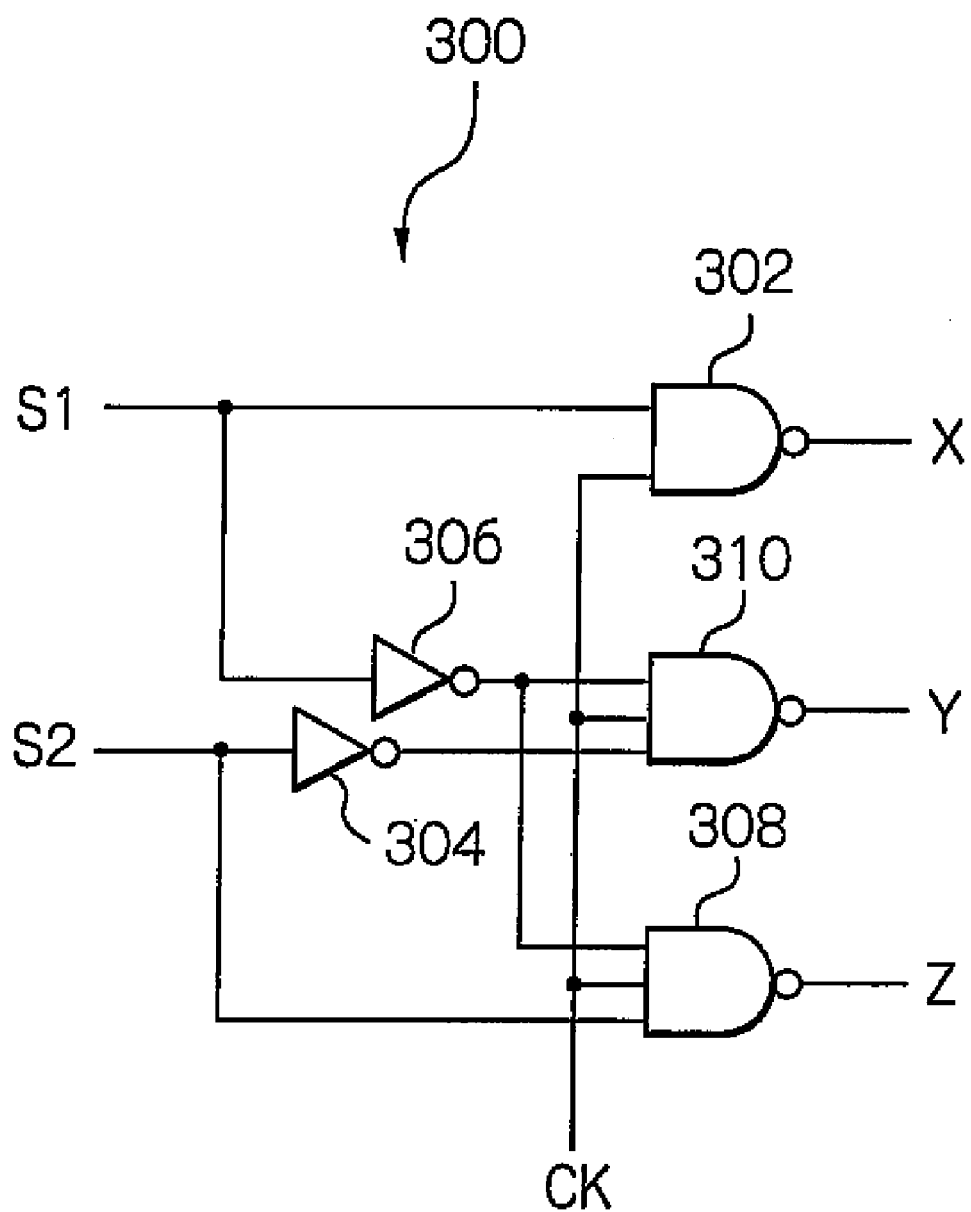
FIG. 4 is a schematic circuit diagram showing a specific configuration of an alternative embodiment of the encoder, according to the present invention.

Well, an alternative embodiment of the present invention will be described with reference to FIG. 4. The converter stage (STG) according to the alternative embodiment may be the same as shown in and described with reference to FIG. 1 except that an encoder 300 is provided in place of the encoder 202. FIG. 4 depicts in a circuit diagram the encoder 300 according to the alternative embodiment. Like components are designated with identical reference numerals.

The encoder 300 is adapted for generating, in case the ADC section 52 outputs a logically incongruent combination of signals S1 and S2, that is, the combination of the signal="H" and the signal S2="L", the same combination of signals X, Y and Z as in the case of VI≦−REF/4, that is, in the case satisfying the condition S1=S2="L".

This encoder 300 includes a dual-input NAND gate 302, inverters 304 and 306, and tri-input NAND gates 308 and 310. The NAND gate 302 is connected to receive the signal S1, while the NAND gates 308 and 310 are connected to receive a signal into which the inverter 306 inverted the signal S1.

The NAND gate 308 is connected to receive the signal S2, while the NAND gates 310 is connected to receive a signal into which the inverter 304 inverted the signal S2. The NAND gates 302, 310 and 308 are also connected to receive the clock signal CK commonly. The NAND gates 302, 310 and 308 output the signals X, Y and Z, respectively.

With the above logical constitution, the combination of signals X, Y and Z output from the encoder 300 depends on the signals S1 and S2 and the clock signal CK, as will read as follows:

for CK="L", signals X, Y and Z are all "H" independently of signals S1 and S2, and for CK="H", (X, Y, Z)=(L, H, H) for (S1, S2)=(H, H), (X, Y, Z)=(L, H, H) for (S1, S2)=(H, L),
(X, Y, Z)=(H, H, L) for (S1, S2)=(L, H) and
(X, Y, Z)=(H, L, H) for (S1, S2)=(L, L).

That is, for the signal S1="H" and the signal S2="L", the combination of signals X, Y and Z is the same as for the signal S1=the signal S2="L".

Thus, in case the ADC section 52 outputs a logically incongruent combination of signals S1 and S2, the encoder 300 of the alternative embodiment generates the signals X, Y and Z corresponding to those for the case of VI<−REF/4 and delivers them to the DAC section 86. This yields the same advantage as described in connection with the embodiment described with reference to FIG. 1.

The present encoder 300 further is advantageous, due to its construction without having any XOR gate in distinction from the encoder 202 of the embodiment shown in FIG. 1, in that the circuit of the encoder 300 can be simplified in constitution and the speed of its logical processing can be improved.

While the present invention has been described with reference to the particular illustrative embodiments, it is not to be restricted by the embodiments. It is to be appreciated that those skilled in the art can change or modify the embodiments without departing from the scope and spirit of the present invention.

For example, (a) In the encoder 300 of the embodiment shown in FIG. 4, in case the signal S1="H" and the signal S2="L", the same combination of signals X, Y and Z is output as when the signal S1=signal S2="L". The encoder however may be constituted so as to output the same combination of signals X, Y and Z as when the signal S1=signal S2="H".

(b) The constitution of the logical gates of the encoders 202 and 300 is merely illustrative and any suitable constitution may be used, which allows for similar logical operations.

(c) In the above embodiments, the encoders 202 and 300 are separately provided from the DAC section 56. However, the digital-to-analog converter may be provided as part of the function of the encoder.

(d) Although the case of using converter stages (STGS) adapted for a 1.5-bit signal has so far been described for the sake of convenience, the present invention may be applied to the case of converter stages of the M+0.5-bit constitution, where M is an integer not less than two.

The entire disclosure of Japanese patent application No. 2008-13379 filed on Jan. 24, 2008, including the specification, claims, accompanying drawings and abstract of the disclosure, is incorporated herein by reference in its entirety.

What is claimed is:

1. A pipelined analog-to-digital converter including a plurality of converter stages interconnected in cascade, each of said converter stages comprising:
   an analog-to-digital converter section for comparing an input voltage to a first reference voltage to output a first signal indicating a result of comparison, and for comparing the input voltage to a second reference voltage lower than the first voltage to output a second signal indicating the result of comparison;
   a digital-to-analog converter section operative in response to a combination of the first and second signals for outputting either one of a third reference voltage, a fourth reference voltage higher than the third reference voltage and a fifth reference voltage lower than the third reference voltage;
   an amplifier for amplifying a difference voltage between the input voltage and the one voltage output from said digital-to-analog converter section to output a resulting signal to a downstream side of said amplifier;
   a digital signal relevant to an analog voltage delivered to an initial converter stage of said converter stages being output in response to the first and second signals output from said analog-to-digital converter section of each of said converter stages; and
   an encoder for outputting, when logical incongruence resides in the combination of the first and second signals output from said analog-to-digital converter section, a signal corresponding to the combination of the first and second signals with logical congruence in the combination to cause said digital-to-analog converter to produce either one of the third reference voltage, the fourth reference voltage and the fifth reference voltage.

2. The pipelined analog-to-digital converter in accordance with claim 1, wherein, if logical incongruence resides in the combination of the first and second signals, said digital-to-analog converter section outputs the third reference voltage.

3. The pipelined analog-to-digital converter in accordance with claim 1, wherein, if logical incongruence resides in the combination of the first and second signals, said digital-to-analog converter section outputs the fourth or fifth reference voltage.

* * * * *